(12) United States Patent
Pelella et al.

(10) Patent No.: US 6,642,119 B1
(45) Date of Patent: Nov. 4, 2003

(54) SILICIDE MOSFET ARCHITECTURE AND METHOD OF MANUFACTURE

(75) Inventors: Mario M. Pelella, Mountain View, CA (US); Shankar Sinha, Redwood Shores, CA (US); Simon S. Chan, Saratoga, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 12 days.

(21) Appl. No.: 10/215,171

(22) Filed: Aug. 8, 2002

(51) Int. Cl.$^7$ .................. H01L 21/336; H01L 21/00; H01L 21/8238; H01L 21/331; H01L 21/24
(52) U.S. Cl. .................. 438/303; 438/151; 438/197; 438/231; 438/306; 438/311; 438/366; 438/533; 438/514; 438/542; 438/559; 438/560; 438/595; 438/630; 438/652; 438/656; 438/682; 438/952
(58) Field of Search .................. 438/151, 197, 438/231, 303, 306, 311, 366, 533, 514, 542, 559, 560, 595, 630, 652, 656, 682, 952

(56) References Cited

U.S. PATENT DOCUMENTS

| | | |
|---|---|---|
| 4,845,534 A | 7/1989 | Fukuta |
| 5,352,631 A | 10/1994 | Sitaram et al. |
| 5,723,893 A | 3/1998 | Yu et al. |
| 5,837,600 A | 11/1998 | Lim et al. |
| 5,930,617 A * | 7/1999 | Wu |
| 6,063,681 A * | 5/2000 | Son |
| 6,391,767 B1 | 5/2002 | Huster et al. |
| 2002/0142524 A1 * | 10/2002 | En et al. |

* cited by examiner

Primary Examiner—John F. Niebling
Assistant Examiner—Stanetta Isaac
(74) Attorney, Agent, or Firm—Eschweiler & Associates, LLC

(57) ABSTRACT

The present invention relates to a method of forming a transistor and a transistor structure. The invention comprises forming the transistor using a double silicide process which reduces resistance and reduces the floating-body-effect when employed in conjunction with SOI type device architecture.

16 Claims, 12 Drawing Sheets

SILICIDE MOSFET ARCHITECTURE AND METHOD OF MANUFACTURE

FIELD OF THE INVENTION

The present invention generally relates to semiconductor transistor devices such as MOS SOI transistors, and relates more particularly to a device structure and method of manufacture in which the transistor uses extension region implants as source/drain regions to form ultra shallow junctions, and can employ a two silicide process to reduce contact resistance associated with the transistor and reduce the floating-body-effect for SOI devices.

BACKGROUND OF THE INVENTION

Transistor devices make up one of the integral components of today's integrated circuits. Consequently, a reduction in the size of transistors (often called "scaling") is constantly being pursued. Prior art FIG. 1 is a fragmentary cross section diagram illustrating a conventional MOS type transistor 10. The transistor 10 consists of a conductive gate region 12 overlying a thin gate oxide 14 which overlies a substrate 16. The gate 12 and the gate oxide 14 are disposed between a drain region 18 and a source region 20 which are formed in the substrate 16 having a channel region 22 located therebetween which underlies the gate 12 and the gate oxide 14.

As the conventional transistor 10 is scaled into the submicron range to reduce its dimensions and thereby improve the transistor packing density on a chip, the transistor 10 begins to experience hot-carrier effects, as illustrated in prior art FIG. 2. These undesirable hot-carrier effects become more evident when the transistor 10 is scaled while maintaining the supply voltage constant or when the supply voltage is not reduced as rapidly as the structural features of the transistor.

The hot-carrier effects are due, at least in part, to an increase in the electrical field within the channel region 22. The increased electric field causes electrons in an inversion layer 26 to be accelerated (or "heated") to an extent that several different undesirable phenomena occur. As illustrated in prior art FIG. 2, the hot-carrier effects can include charge injection, substrate current and electron injection into the gate oxide 14. Perhaps the most crucial hot-carrier effect is the charge injection into the gate oxide 14 which damages the thin oxide and leads to a time-dependent degradation of various transistor characteristics such as the threshold voltage ($V_T$), the linear transconductance ($g_m$) and the saturation current ($I_{DSAT}$).

One prior art solution which reduces the undesired hot-carrier effects of traditional transistor structures is the lightly doped drain (LDD) transistor 30, which is illustrated in prior art FIG. 3. The LDD transistor 30 includes the gate 12 and the gate oxide 14 formed in a conventional manner, wherein a lightly doped extension region 32 is formed between the drain region 18 and the channel 22 and the source region 20 and channel, respectively. The lightly doped extension regions 32 typically reduce the electric field near the channel region 22 by about 30–40 percent and thus the hot-carrier reliability of the transistor is greatly improved. The extension regions 32 reduce the electric field by effectively dropping a portion of the drain voltage across the extension region 32.

As transistor designers continue to scale down the transistor device dimensions, the junction depths of the source and drain regions (as well as the lightly doped drain extension region) also need to be reduced (i.e., make the junctions more shallow). Junction depths must be reduced in conjunction with scaling in order to prevent short channel transistor effects such as punchthrough and threshold voltage shift. One conventional approach to reducing the junction depth is to reduce the implant energy used to form the junctions and reduce the diffusion of the junctions in the vertical direction. At the same time, in order to maintain a reasonably low extension region resistance, the dopant concentration must be increased. Such an increase, however, negatively leads to greater diffusion which negatively impacts the shallow nature of the junction. Therefore there is a need in the art to make ultra-shallow junctions without negatively impacting the junction resistance.

In addition to the above issues, the switching speed of a transistor is an important characteristic since it dictates, at least in one respect, how fast the circuits which employ such devices operate. Presently, the switching speed of a transistor is not limited by the channel transit time (i.e., the time required for charge to be transported across the channel); instead, the switching speed is limited by the time required to charge and discharge the capacitances that exist between the device electrodes and between the interconnecting conductive lines and the substrate.

One way of appreciating the transistor capacitances is through an exemplary transistor cross section, as illustrated in prior art FIG. 4. The NMOS transistor, designated at reference numeral 50, includes a p-type region 52 (sometimes referred to as the body), such as a P-well in a CMOS type process. The body 52 has an n-type drain region 54 formed therein and a lightly doped extension region 56. Likewise, a source region 58 and a lightly doped extension region 56 is formed in the body 52. A doped polysilicon gate 72 overlies a thin gate oxide 74 which defines a channel region 76 therebeneath in the body 52.

An effective circuit diagram illustrating the various transistor capacitances is illustrated in prior art FIG. 5. As seen in FIG. 5, capacitances exist between the various device electrodes and between the electrodes and the body region. The drain-to-body capacitance ($C_{db}$) and the source-to-body capacitance ($C_{sb}$) often are referred to as junction capacitances. The value of the junction capacitances are a function of both the cross sectional area of the junctions as well as the doping concentrations of the regions, respectively.

One attempt to increase the performance of the transistor 50 of prior art FIG. 4 reduces the junction capacitances by forming the transistor on an insulating region. Such a transistor device structure is called a silicon-on-insulator (SOI) device and is illustrated in prior art FIG. 6. The SOI transistor, designated at reference numeral 80, has components similar to the transistor 50 of prior art FIG. 4. In the SOI transistor 80, however, the body 52 is not formed in the bulk semiconductor material as in FIG. 1, but rather overlies an insulating layer 82 such as silicon dioxide ($SiO_2$) and is often called a buried oxide (or BOX). The insulating layer 82, in turn, overlies a bulk semiconductor material 84.

The SOI transistor 80 provides several performance advantages over traditional bulk transistor devices. Initially, since each device can be completely isolated from one another (as opposed to sharing a common body), better individual device isolation is achieved, which prevents circuit latch-up conditions. In addition, since at least a portion of the drain region 54 and the source region 58 abut the insulating layer 84, the cross sectional area of the source/body and drain/body interfaces is reduced and thus the junction capacitance is significantly reduced.

Although SOI devices provide several advantages over prior art bulk type devices, an SOI transistor also has several disadvantages. One disadvantage of SOI transistors could be (depending upon the application) the lack of bulk silicon or body contact to the transistor. In some cases it is desirable to connect the SOI body region 52 to a fixed potential in order to avoid "floating-body-effects." Use of a body contact for each transistor device, however, undesirably increases the device size and thus is not an amenable solution.

The floating-body-effects refer generally to various hysteresis effects which are associated with the body 52 being allowed to float relative to ground. Two such floating-body-effects include the "kink" effect and the parasitic lateral bipolar effect. The "kink" effect originates from impact ionization. When the SOI transistor 80 is operated at a relatively high drain-to-source voltage, channel electrons having sufficient kinetic energy cause an ionizing collision with the lattice, resulting in carrier multiplication near the drain end of the channel. The generated holes build up in the body 52 of the device 80, thereby raising the body potential. The increased body potential reduces the threshold voltage of the transistor 80, thus increasing the transistor current, which results in a "kink" in the transistor current/voltage (I/V) curves.

The second floating-body-effect includes the parasitic lateral bipolar effect. As discussed above, if impact ionization generates a large number of holes, the body bias may be raised to a sufficient voltage so that the source/body p-n junction becomes forward biased. When this junction becomes forward biased, minority carriers are emitted into the body 52 which causes a parasitic lateral NPN bipolar transistor to turn on. Such parasitic transistor action leads to a loss of gate control of the transistor current and is therefore highly undesirable.

Therefore there is a need in the art for a device and method of manufacture for providing transistor devices having lower resistance and reduced junction capacitance without altering the fundamentals of the device operation.

SUMMARY OF THE INVENTION

The following presents a simplified summary of the invention in order to provide a basic understanding of some aspects of the invention. This summary is not an extensive overview of the invention. It is intended neither to identify key or critical elements of the invention nor to delineate the scope of the invention. Its primary purpose is to present some concepts of the invention in a simplified form as a prelude to the more detailed description that is presented later.

The present invention relates to a method of forming a transistor and a transistor structure. The method and structure provide for a device exhibiting a substantial reduction in extension region resistance due to a double silicide process in which a first silicide is formed over the extension regions near a first sidewall spacer formed on lateral edges of a gate structure after the extension region formation. After formation of a second sidewall spacer on lateral edges of a gate structure (covering the first spacers), a second silicide is formed over an exposed portion of the first silicide and on a top portion of the gate structure. In one example, a source/drain implant is performed after the second spacers are formed and prior to the second silicide. Alternatively, the source/drain implant is forgone and the extension regions are employed as ultra-shallow source/drain regions.

In accordance with one aspect of the present invention, a method of forming a transistor comprises forming a gate structure over a semiconductor substrate. First sidewall spacers are formed on lateral edges of the gate structure and an extension region implant is performed either before or after the first sidewall spacer formation. A first metal layer is deposited over the substrate and is subjected to thermal processing to form a first silicide over the extension regions. In one example, a first silicide is also formed over a top portion of the gate structure, while in another example, such silicidation is avoided by maintaining an insulative mask structure over the top portion bf the gate after the patterning thereof.

The method further comprises forming second sidewall spacers on the lateral edges of the gate structure, thereby overlying and covering the first spacers, and performing a source/drain implant through the first silicide in portions of the extension region not covered by the sidewall spacers. A second metal layer is then deposited over the substrate and subjected to thermal processing to form a second silicide over portions of the first silicide not covered by the sidewall spacers and on the top portion of the gate structure. The double silicide process allows for a substantial reduction in extension region resistance and provides other benefits as will be discussed later in greater detail.

In yet another aspect of the present invention, the traditional deep source/drain implant is eliminated and an extension region implant is employed to form ultra-shallow source/drain regions. The method employs a double silicide process and comprises forming a gate structure over a semiconductor substrate. First sidewall spacers are formed on lateral edges of the gate structure and an extension region implant is performed either before or after the first sidewall spacer formation to form source/drain regions. A first metal layer is deposited over the substrate and is subjected to thermal processing to form a first silicide over the source/drain regions. In one example, a first silicide is also formed over a top portion of the gate structure, while in another example, such silicidation is avoided by maintaining an insulative mask structure over the top portion of the gate after the patterning thereof.

The method further comprises forming second sidewall spacers on the lateral edges of the gate structure, thereby overlying and covering the first spacers. A second metal layer is then deposited over the substrate and subjected to thermal processing to form a second silicide over portions of the first silicide not covered by the sidewall spacers and on the top portion of the gate structure. The double silicide process allows for a substantial reduction in source/drain region resistance and allows for ultra-shallow source/drain regions by allowing such regions to be formed using extension region implants.

In accordance with still another aspect of the present invention, a MOS transistor structure is disclosed. The transistor comprises a gate structure overlying a semiconductor substrate with extension regions formed in the substrate on opposite sides thereof, thereby defining a channel region therebetween. First sidewall spacers reside on lateral edges of the gate structure and a first silicide overlies portions of the extension regions. The first silicide regions extend into the extension regions to a depth which is less than a depth of the extension regions and substantially abut the first sidewall spacers. Second sidewall spacers reside on the lateral edges of the gate structure and cover the first spacers. The second silicide regions overlie remaining outside portions of the extension regions and extend into the source/drain regions to a depth which is greater than the first silicide regions. The second silicide regions substantially abut the second sidewall spacers. The double silicide structure allows for reduced extension region resistance and provides various other advantages as will be described later in greater detail.

To the accomplishment of the foregoing and related ends, the invention comprises the features hereinafter fully described. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
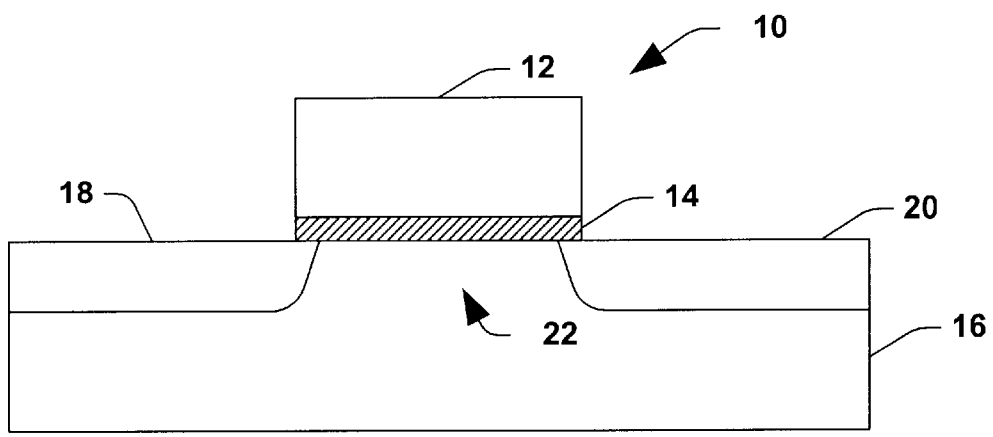
FIG. 1 is a prior art fragmentary cross section diagram illustrating a conventional MOS type transistor structure.
Figure 2:
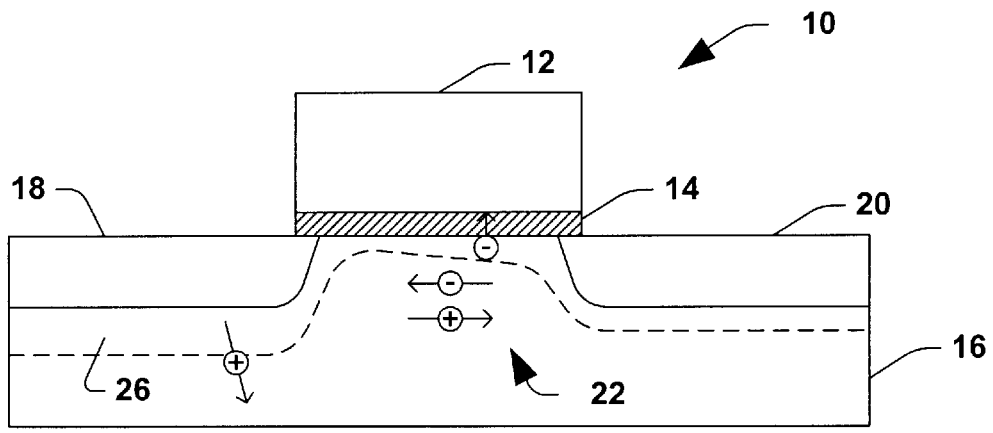
FIG. 2 is a prior art fragmentary cross section diagram illustrating a conventional MOS type transistor structure and various types of short channel effects that may arise as such structures reduce in size.
Figure 3:
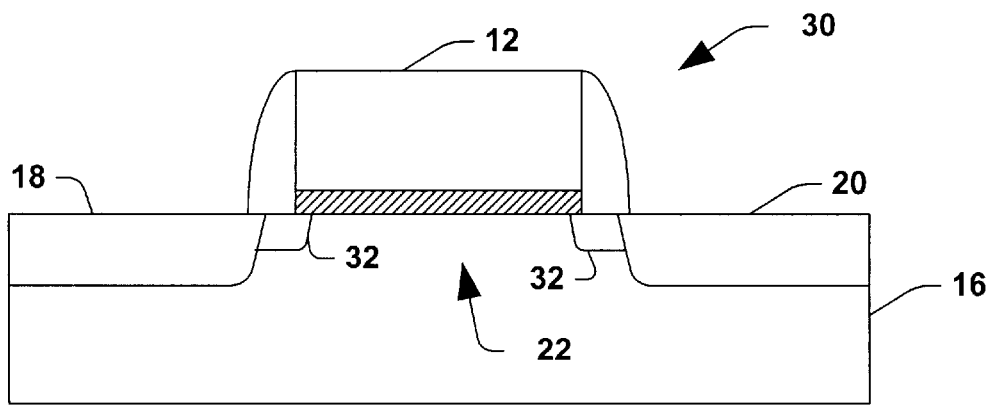
FIG. 3 is a prior art fragmentary cross section diagram illustrating a conventional LDD MOS type transistor structure employed to mitigate short channel effects.
Figure 4:
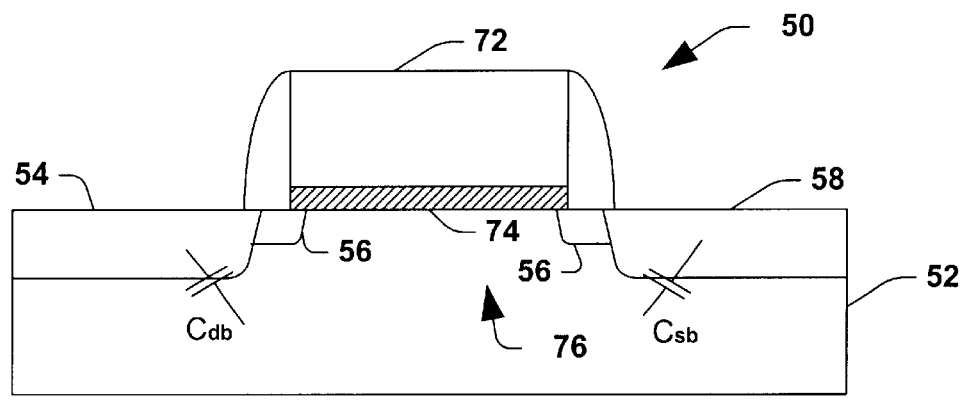
FIG. 4 is a prior art fragmentary cross section diagram illustrating junction capacitances associated with a conventional LDD MOS type transistor structure.
Figure 5:
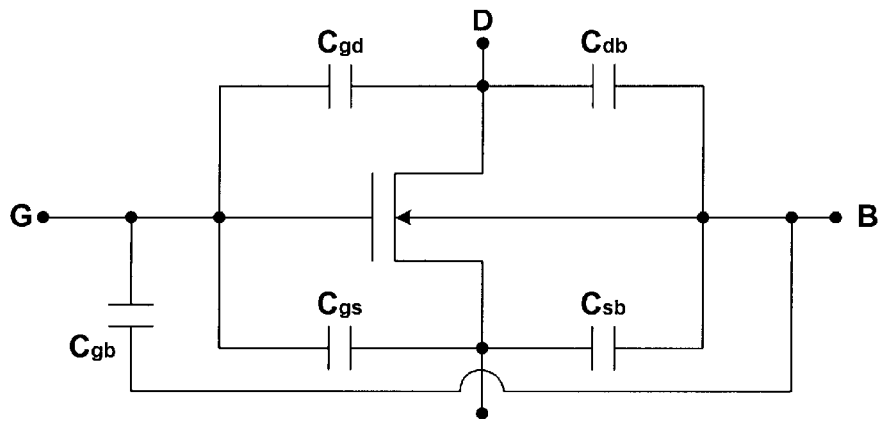
FIG. 5 is a prior art schematic diagram illustrating various capacitances associated with a traditional MOS type transistor structure.
Figure 6:
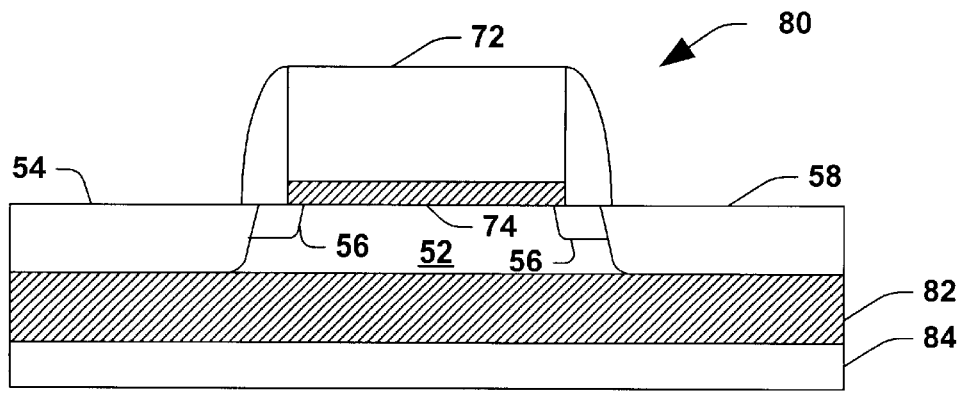
FIG. 6 is a prior art fragmentary cross section diagram illustrating an SOI LDD MOS type transistor structure exhibiting reduced junction capacitance.

The present invention will now be described with reference to the drawings, wherein like reference numerals are used to refer to like elements throughout.

The present invention provides a method of forming a transistor and an associated transistor structure having several advantages over the prior art. The method includes employing a double silicide process that minimizes the extension region resistance of a MOS type transistor, and such double silicidation may be employed in both bulk silicon and SOI type devices. The double silicide process results in a unique transistor structure in which a first silicide having a first thickness resides over a portion of the extension region(s), while a second silicide having a second, greater thickness resides over the source/drain regions, respectively. The double silicide structure results in decreased resistance and also provides improved transistor performance, particularly with respect to SOI devices, as will be discussed in greater detail below.

Figure 7:
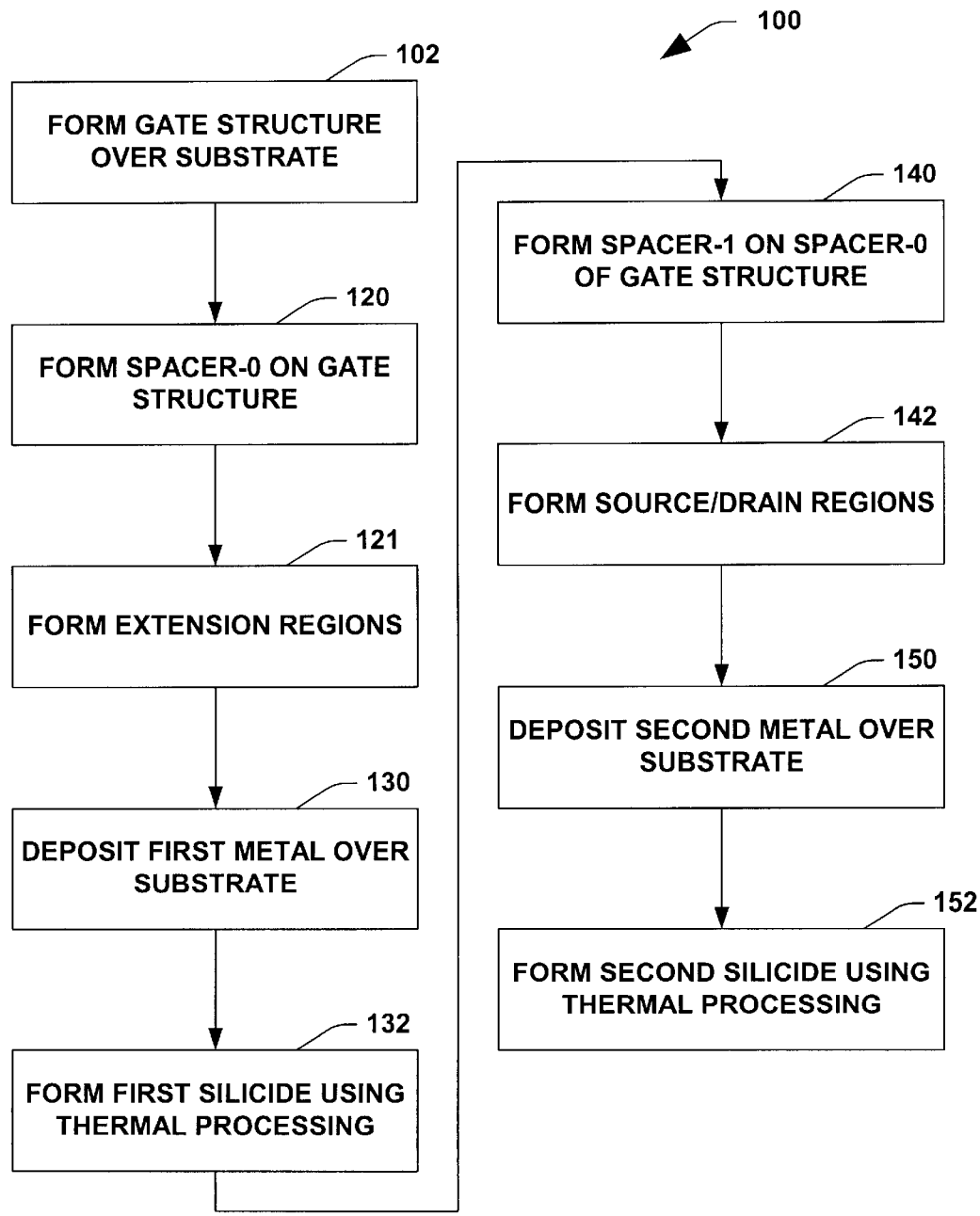
FIG. 7 is a flow chart diagram illustrating a method of forming a MOS type transistor structure with a double silicide process according to an aspect of the present invention.

Turning now to the figures, FIG. 7 is a flow chart diagram illustrating a method 100 of forming a transistor using a double silicide process, and will be described in conjunction with FIGS. 8A–8E. Although the method 100 is illustrated and described hereinafter as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention. Furthermore, the methods according to the present invention may be implemented in association with the formation and/or processing of structures illustrated and described herein as well as in association with other structures not illustrated.

Figure 8A:
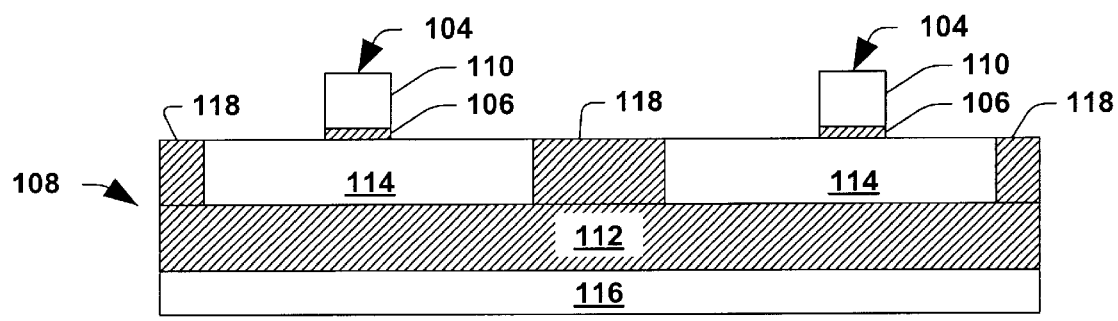
FIGS. 8A–8E are fragmentary cross section diagrams illustrating a plurality of acts associated with the fabrication of a MOS type transistor structure in accordance with the method of FIG. 7 in accordance with the present invention.

The method 100 begins at 102 with the formation of a gate structure over a semiconductor substrate. For example, as illustrated in FIG. 8A, a gate structure 104 comprises a thin gate oxide 106 (or high-k dielectric) formed over a semiconductor substrate such as silicon 108 with a conductive gate electrode material 110 such as polysilicon formed thereover. Such a gate structure 104 may be formed via a thermal oxidation followed by a deposition of polysilicon (e.g., via chemical vapor deposition (CVD)) which is then patterned using a masking layer (not shown) over the gate structure which is subsequently removed. The semiconductor substrate 108 may be a bulk silicon substrate or, as illustrated in FIG. 8A may comprise a substrate having an insulating layer 112 (sometimes referred to as a barrier oxide or BOX) formed therein for an SOI transistor structure, thereby dividing the substrate into a top portion 114 which may be referred to as the body, and a bottom portion 116 which may be referred to as the bulk substrate. Multiple active regions may be isolated from one another via isolation regions 118 which are sometimes referred to as field oxide regions. Such field oxide regions 118 may be formed, for example, using a shallow trench isolation (STI) process or via LOCOS.

Figure 8B:
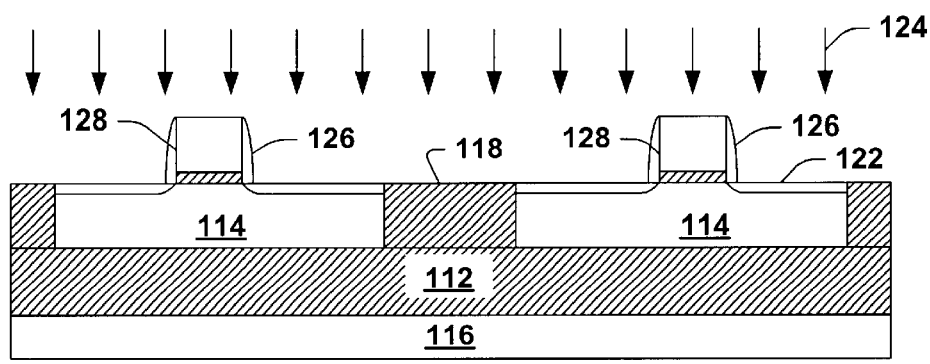

Returning to FIG. 7, the method 100 continues at 120 with the formation of a first spacer on the gate structure(s) 104 and at 121 with the formation of extension regions. For example, as illustrated in FIG. 8B, extension regions 122 are formed in the body portion 114 of the substrate, wherein the extension regions are self-aligned with respect to the gate structure 104. In one example, the extension regions 122 are formed via an ion implantation 124 prior to the formation of the first spacers, however, the extension regions may be formed after such spacer formation. The first spacers 126 (which may be referred to as a spacer-0 since such a spacer was typically not used and is formed prior to what previously was considered a first spacer) are formed on lateral edges 128 of the gate structure 104, for example, by depositing an insulating material such as a thin silicon nitride film over the substrate and then etching the film in a generally anisotropic fashion. Other processes for forming the extension regions 122 and the spacers 126, however, may be employed and such processes are contemplated as falling within the scope of the present invention.

Figure 8C:
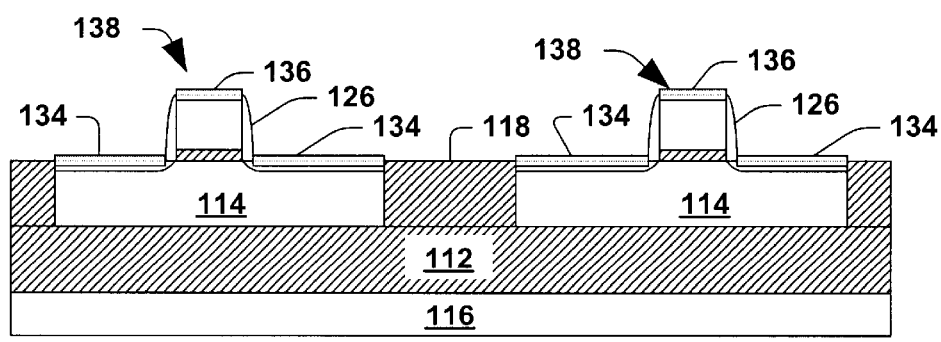

The method 100 continues at 130 and 132 with the formation of a first silicide. At 130 a metal layer is deposited over the substrate via, for example, sputtering or CVD, however, other deposition processes may be utilized. Thermnal processing is then employed, wherein the deposited metal reacts with silicon to form a silicide. The unreacted metal is then removed, for example, using a wet or dry etch, or other type of clean procedure. As illustrated in FIG. 8C, the first silicide process results in a first silicide 134 formed over the extension regions 122 and a first silicide 136 formed over a top portion 138 of the gate structure 104. The first spacers 126 serve to prevent silicide from forming on the lateral edges of the gate structure and thus prevents the gate electrode 110 and the extension regions 122 from becoming electrically connected. As illustrated in FIG. 8C, the first suicides 134 about the first spacers 126 and substantially overlie the extension regions. This silicide 134 results in a significant reduction in extension region resistance, for example, from about 400–900 Ω/square (depending on whether NMOS or PMOS devices) to about 10–20 Ω/square.

Figure 8D:
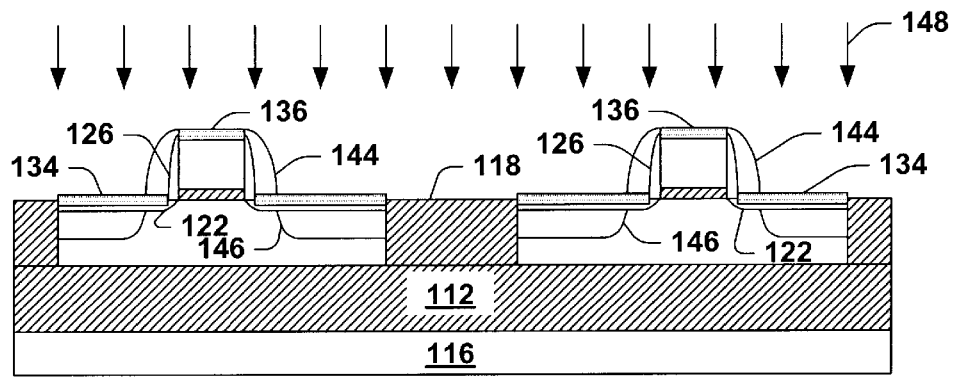

Returning to FIG. 7, the method 100 continues at 140 and 142 with the formation of a second spacer followed by the formation of source/drain regions. For example, as illustrated in FIG. 8D, second spacers 144 are formed on the lateral edges of the gate structure 104, wherein the second spacers cover the first spacers 126. The second spacers 144 typically are substantially wider than the first spacers 126 and may be formed by depositing another insulating material such as a silicon nitride film (typically thicker than the film employed for the first spacers 126) and again etching the insulating material in a generally anisotropic manner to obtain the spacers 144 as illustrated. In one example, the second spacers 144 may be formed with a single insulating material film, however, multi-layer spacer films may also be employed and are contemplated as falling within the scope of the present invention.

After the formation of the second spacers 144 (which may also be referred to as the spacer-1 event) at 140 of FIG. 7, source/drain regions 146 are formed at 142 via, for example, an ion implantation 148, as illustrated in FIG. 8D. The source/drain implant 148 is performed through the first silicide regions 134 and such implantation has a higher dose and energy than the extension region implant 124 to generate the source/drain regions 146 having a higher dopant concentration and depth than the extension regions 122, as illustrated. Since the activation of the source/drain regions 146 typically employ a relatively high temperature anneal, the first silicide regions 134 may advantageously be a refractory metal material such as titanium or tungsten which is not substantially impacted by such thermal processing. Alternatively, other type metals may be employed and are contemplated by the present invention.

Figure 8E:
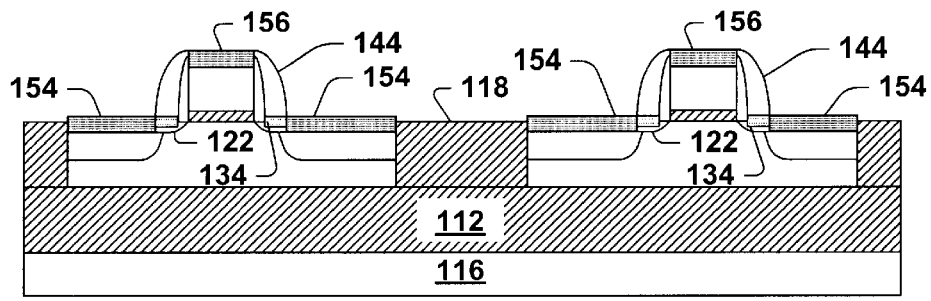

At 150 of FIG. 7, a second metal layer is formed over the substrate followed by thermal processing at 152 to form a second silicide. For example, as illustrated in FIG. 8E, the second metal is deposited via sputtering, CVD or other deposition process and subjected to thermal processing, wherein the silicon in portions of the first silicide regions 134 and 136 in contact with the second metal layer react therewith. Such reaction forms second silicide regions 154 which consume a portion of the first silicide regions 134 overlying the source/drain regions 146 (and not the portion underlying the second spacers 144) and a second silicide region 156 which consumes a portion or all of the first silicide region 136 which resided on the top portion of the gate structure 104. In accordance with one exemplary aspect of the present invention, the second metal layer may be titanium, tungsten, cobalt or nickel, thereby resulting in a second silicide comprising titanium silicide, tungsten silicide, cobalt silicide or nickel silicide, respectively. Alternatively, other metals may be employed and such alternatives are contemplated as falling within the scope of the present invention.

Figure 9A:
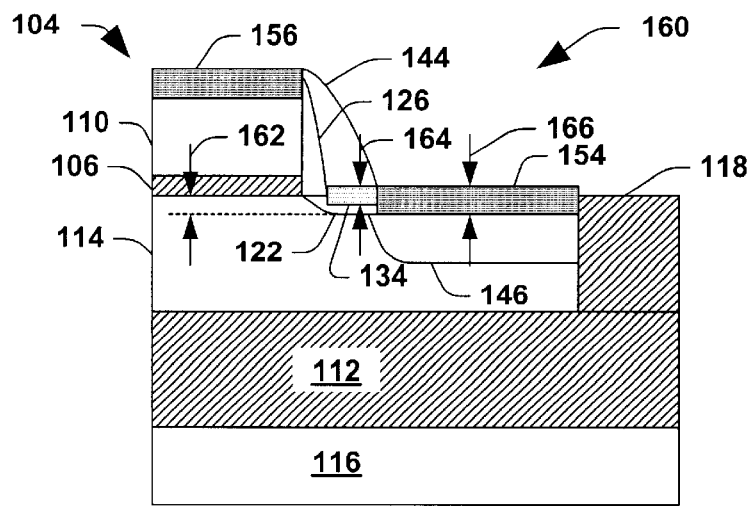
FIGS. 9A–9C are fragmentary cross section diagrams illustrating double silicide transistor structures according to the present invention.
Figure 9B:
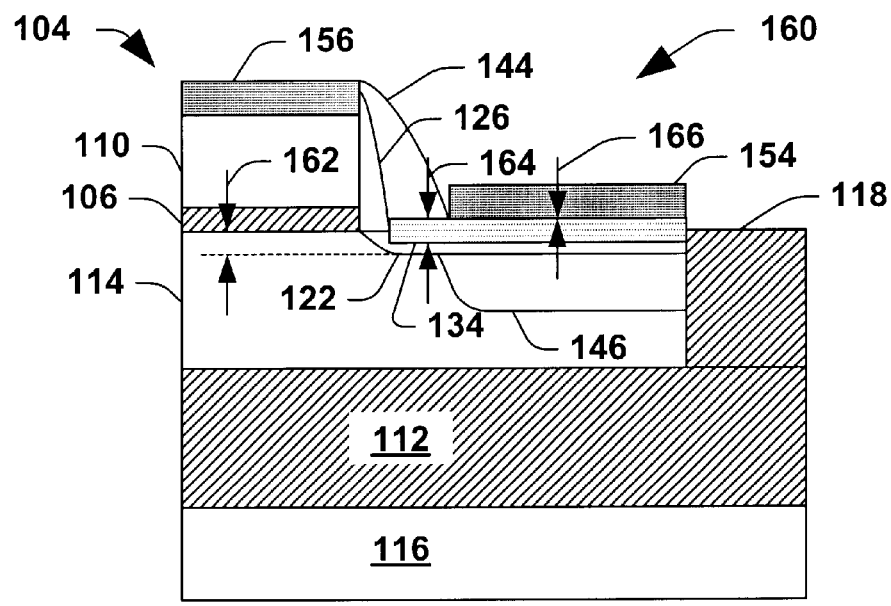
Figure 9C:
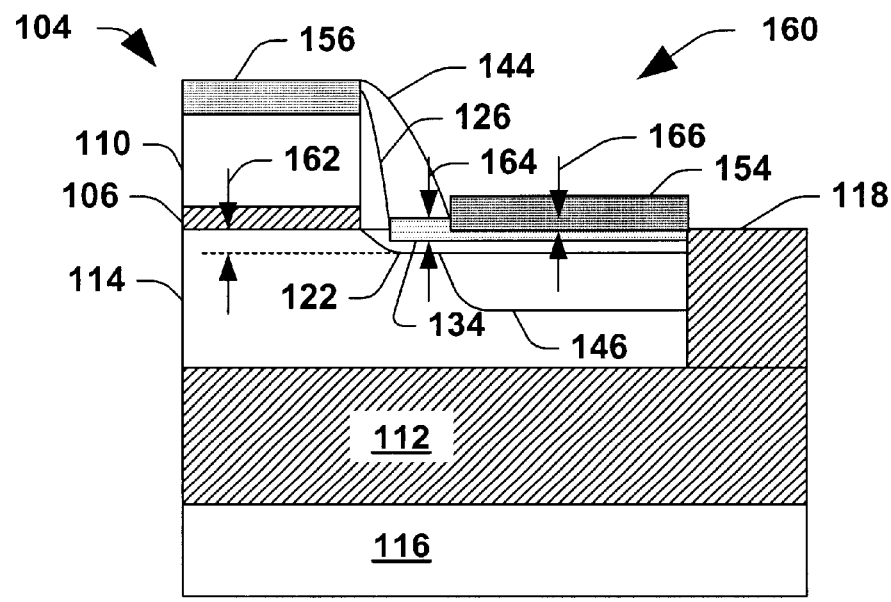

The method 100 of FIG. 7 results in a transistor structure 160, enlarged partial cross sections of which are illustrated in FIGS. 9A–9C, respectively. The transistor 160 comprises the gate structure 104 overlying the body portion 114 of the semiconductor substrate. The extension region 122 extends within the body 114 to a first depth 162 on opposite sides of the gate structure 104 (only one side being illustrated in FIGS. 9A–9C) and the extension regions 112 define a channel region therebetween under the gate structure 104. First sidewall spacers 126 reside on lateral edges of the gate structure 104 and first silicide regions 134 overlie portions of the extension regions on each side of the gate structure as illustrated. The first silicide regions 134 extend within the extension regions 122 (and thus, in one sense, into the body 114) to a second depth 164 which is less than the first depth 162 and substantially abut the first sidewall spacers 126.

The transistor 160 further includes the second sidewall spacers 144 on the lateral edges of the gate structure 104 and covering the first sidewall spacers 126. The second spacers 144 overlie the first silicide regions 134 as shown. Second silicide regions 154 overlie the source/drain regions 146 and substantially abut the second sidewall spacers 144. The second silicide regions 154 can extend into the source/drain regions to a third depth 166 which is greater than the second depth 164, as illustrated in FIG. 9A. Alternatively, the second silicide regions 154 may reside on top of the first silicide regions 134, in which case the third depth 166 is zero, as illustrated in FIG. 9B. In yet another alternative, the second silicide regions 154 may extend into a portion of the first silicide regions 134, as illustrated in FIG. 9C, wherein the third depth 166 is less than the second depth 164. Therefore although the third depth 166 is illustrated as co-extensive with the first depth 162 in FIG. 9A, the third depth may be greater or less than the first depth 162 in accordance with the present invention, as illustrated in FIGS. 9A–9C, respectively. In addition, the second silicide region 156 resides on the top portion of the gate structure 104 as illustrated in FIGS. 9A–9C.

The transistor structure 160 of FIGS. 9A–9C has several significant advantages over prior art devices. For example, in SOI type transistors, as discussed earlier, the floating-body-effect is a substantial problem. In the present structure 160, since the first silicide 134 is substantially closer to the junction edge (near the channel) than conventional devices, the first silicide 134 acts as a recombination center which increases the recombination current in the device. The increase in recombination current causes a reduction in the floating carriers within the body 114, thus decreasing the charge therein. Accordingly, the transistor 160 reduces the floating-body-effect and thus reduces an amount in which the body 114 accumulates a substrate bias, which advantageously allows better gate control by preventing a substantial modulation of the threshold voltage ($V_T$).

Figure 10:
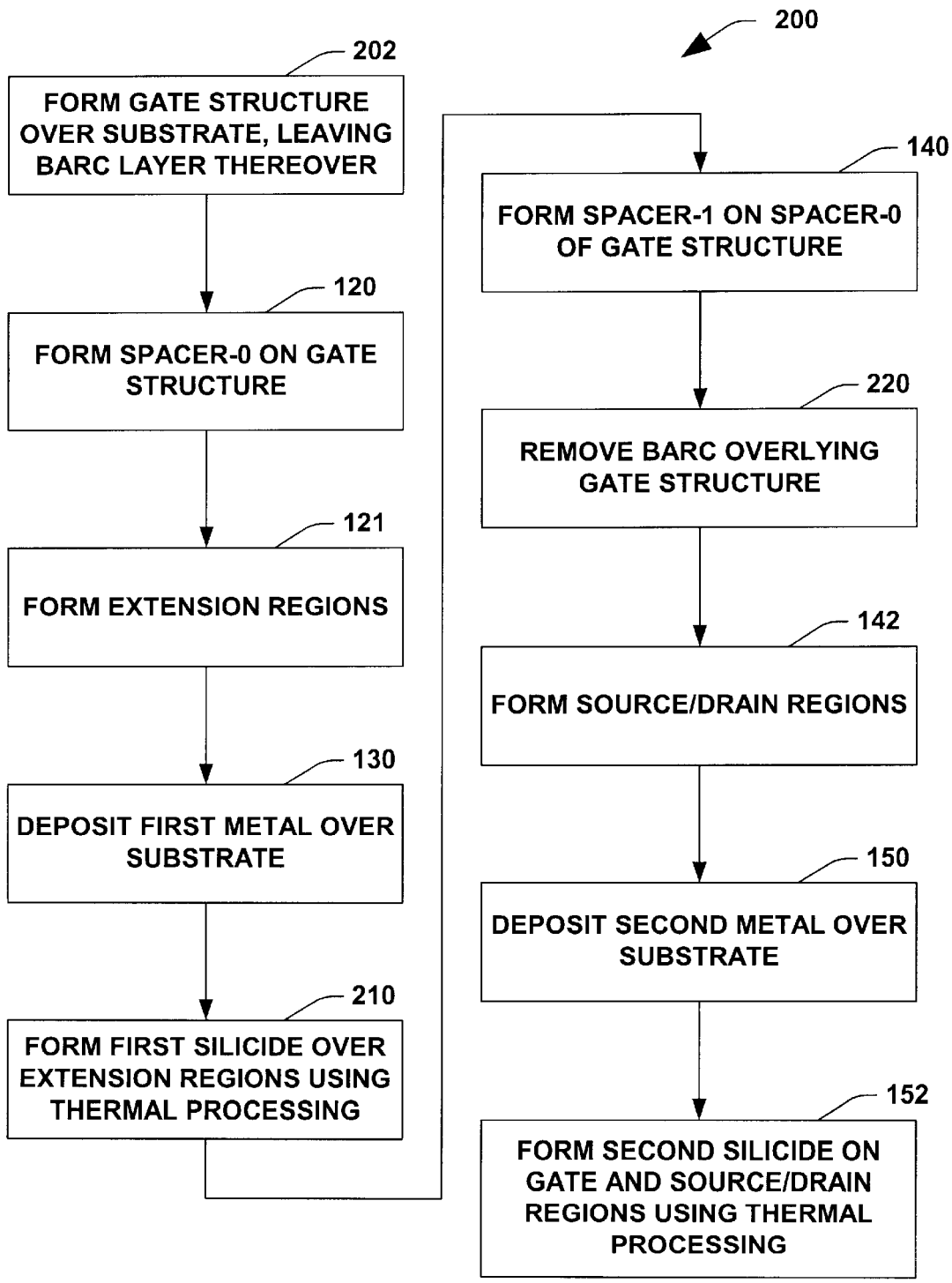
FIG. 10 is a flow chart diagram illustrating a method of forming a MOS type transistor structure with a double silicide process according to another aspect of the present invention.
Figure 11A:
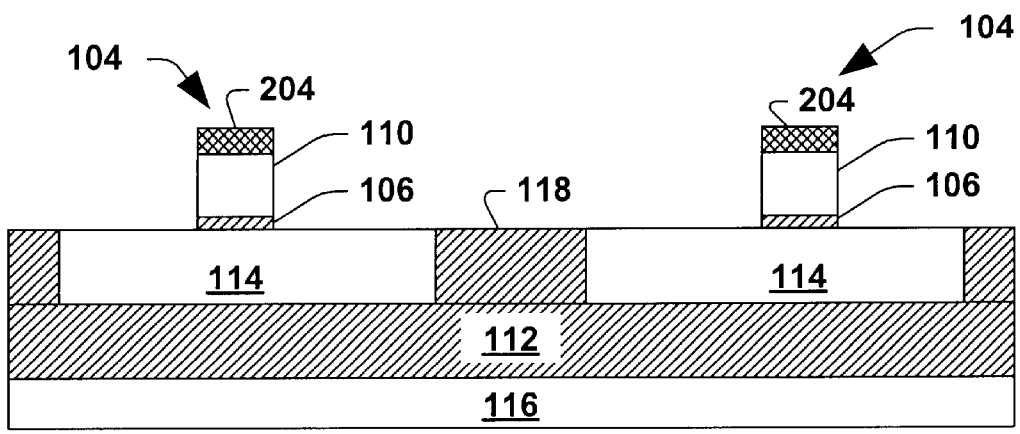
FIGS. 11A–11E are fragmentary cross section diagrams illustrating a plurality of acts associated with the fabrication of a MOS type transistor structure in accordance with the method of FIG. 8 in accordance with the present invention.

In accordance with another aspect of the present invention, a method of forming a transistor is illustrated in FIG. 10 and designated at reference numeral 200. The method 200 begins at 202 with the formation of the gate structure 104 overlying the body portion 114 of the substrate. However, as illustrated in FIG. 11A, a mask portion 204 employed to pattern the gate structure 104 is left on the top portion thereof. In accordance with one exemplary aspect of the present invention, the mask layer 204 comprising a resist and/or an anti-reflective coating (BARC), however, other materials which are selective with respect to the gate electrode material 110 may be employed and are contemplated as falling within the scope of the present invention.

Figure 11B:
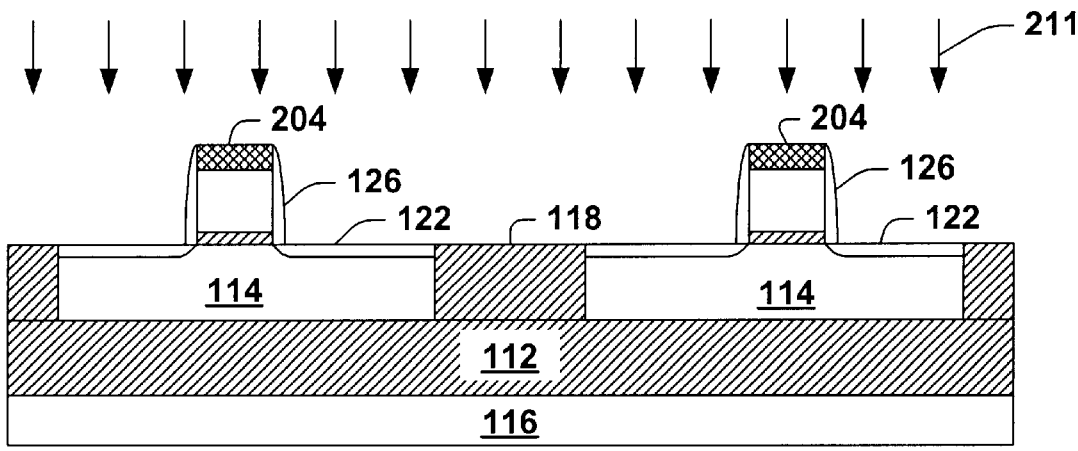
Figure 11C:
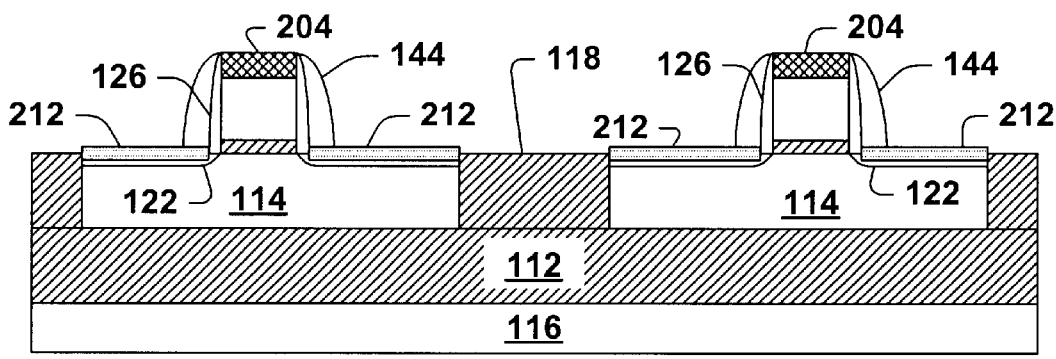
Figure 11D:
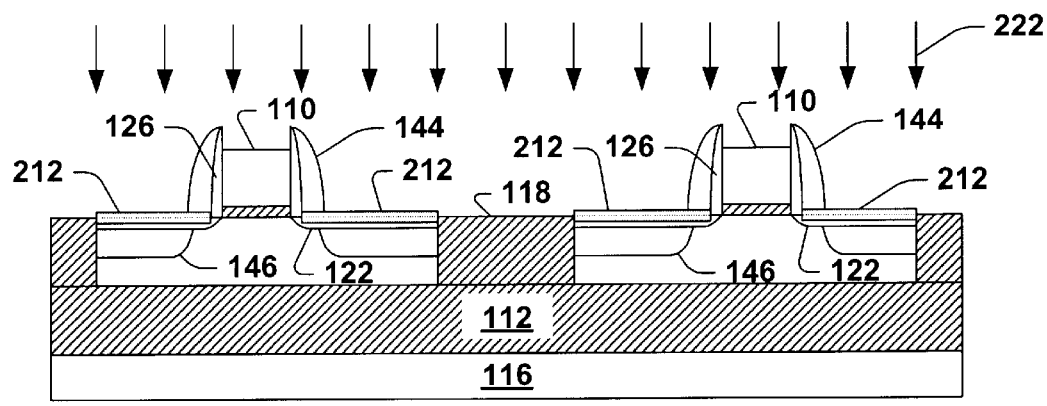

The method 200 then proceeds at 120 and 121 in a manner similar to that described in conjunction with FIG. 7. For example, first sidewall spacers 126 are formed on lateral edges of the gate structure 104 and extension regions 122 are formed in the body portion 114 via an ion implantation 211, illustrated in FIG. 11B. A first metal layer is then formed over the substrate at 130 using sputtering, CVD or other deposition process, and thermal processing is then performed at 210 to form first silicide regions 212, as illustrated in FIG. 11C.

Note that since the masking layer 204 still resides on the top portion of the gate structure 104 during the first silicidation, no first silicide is formed on the top portion of the gate structure. Rather, the silicide regions 212 form only over the extension regions 122 since those are the only portions in which the metal contacts silicon. Second sidewall spacers 144 are then formed over the lateral edges of the gate structure and cover the first sidewall spacers 126 at 140, as illustrated in FIG. 11C. Note that the second sidewall spacers 144 are typically substantially thicker than the first spacers 126 in the present example.

The method 200 of FIG. 10 continues at 220 with the removal of the mask layer 204 which overlies the top portion of the gate structure 104. Such removal may be performed, in one example, via a dry etch, however, other removal processes may also be employed. Source/drain regions 146 are then formed at 142 via, for example, an ion implantation 222 which proceeds through the first silicide regions 212 and concurrently dopes the gate electrode material 110 such as polysilicon. Subsequent activation of the dopant then causes the gate dopant to diffuse therethrough and lower the gate resistance.

Figure 11E:
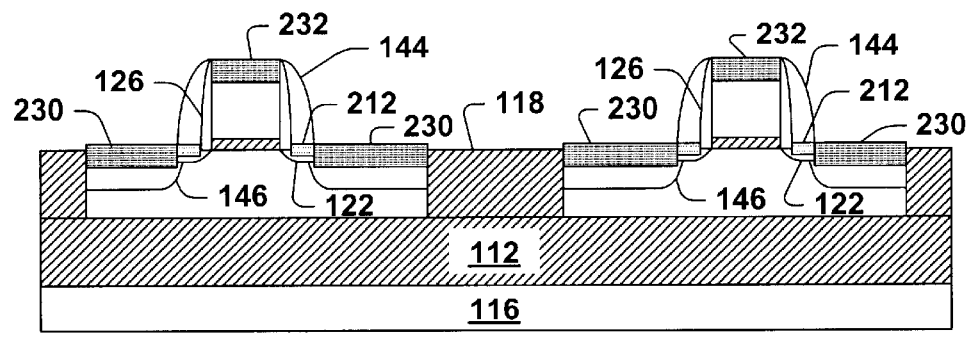

A second metal layer is then deposited over the substrate at 150 followed by thermal processing at 152 which forms second silicide regions 230 which overlie the source/drain regions 146 and another second silicide region 232 over the top portion of the gate structure, as illustrated in FIG. 11E. Note that the second silicide regions 230 consume portions of the first silicide 212 which do not underlie the second spacers 144. The resultant structure is similar to that illustrated in FIGS. 9A–9C, wherein first silicide regions 212 reside within the extension regions 122 and abut the first spacers 126, while second silicide regions 230 overlie the source/drain regions 146 and abut the second sidewall spacers 144. In addition, the extension regions extend to a first depth 162 while the first silicide 212 extends to a second depth 164 which is less than the first depth. In addition, the second silicide 230 extends to a third depth 166 which may be greater than or less than the second depth, as discussed above and as illustrated in FIGS. 9A–9C. The structure resultant from the method 200 of FIG. 10 differs slightly from the transistor 160 of FIGS. 9A–9C in that the gate silicide structure 232 of the transistor in FIG. 11E is independent of the first silicide 212 which formed solely on the source/drain extension regions. Therefore the gate silicide 232 may be further tailored independently of the first silicide, as may be desired.

Figure 12:
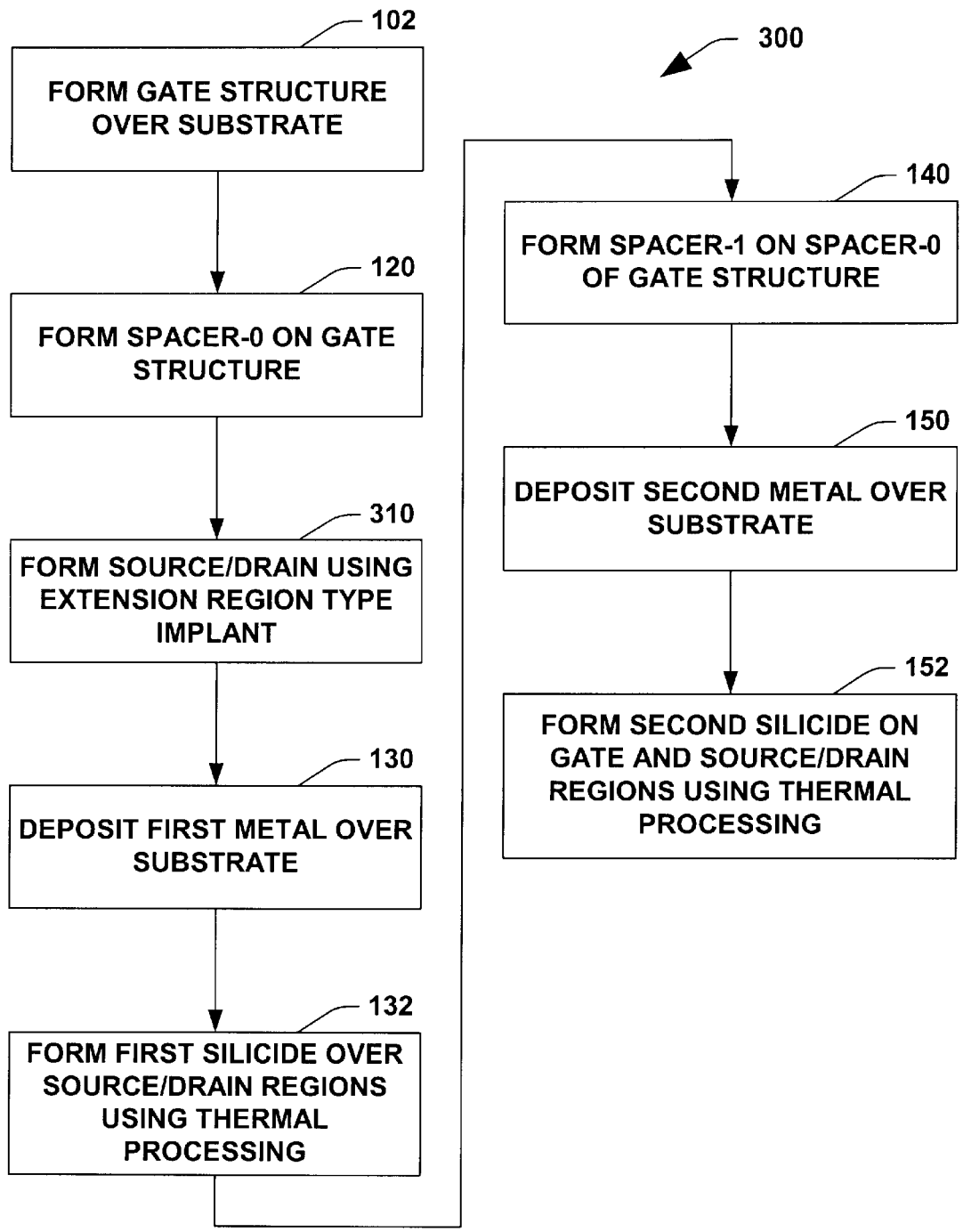
FIG. 12 is a flow chart diagram illustrating a method of forming a MOS type transistor structure with a double silicide process according to yet another aspect of the present invention.
Figure 13A:
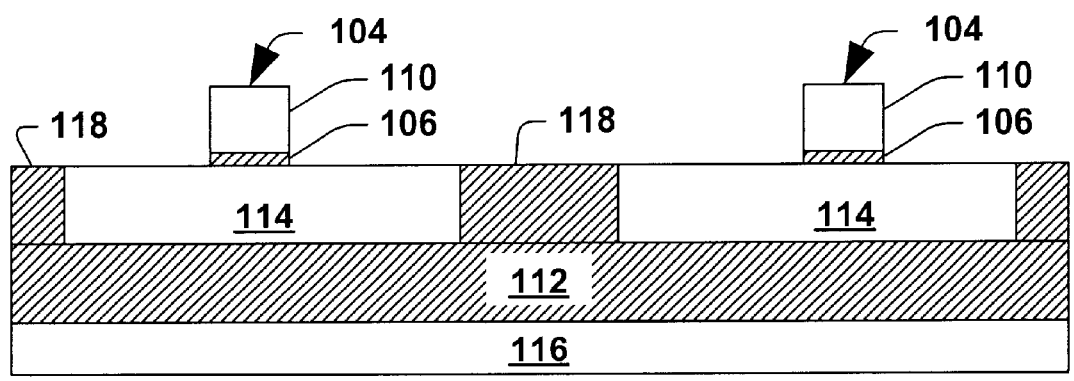
FIGS. 13A–13D are fragmentary cross section diagrams illustrating a plurality of acts associated with the fabrication of a MOS type transistor structure in accordance with the method of FIG. 11 in accordance with the present invention.
Figure 13B:
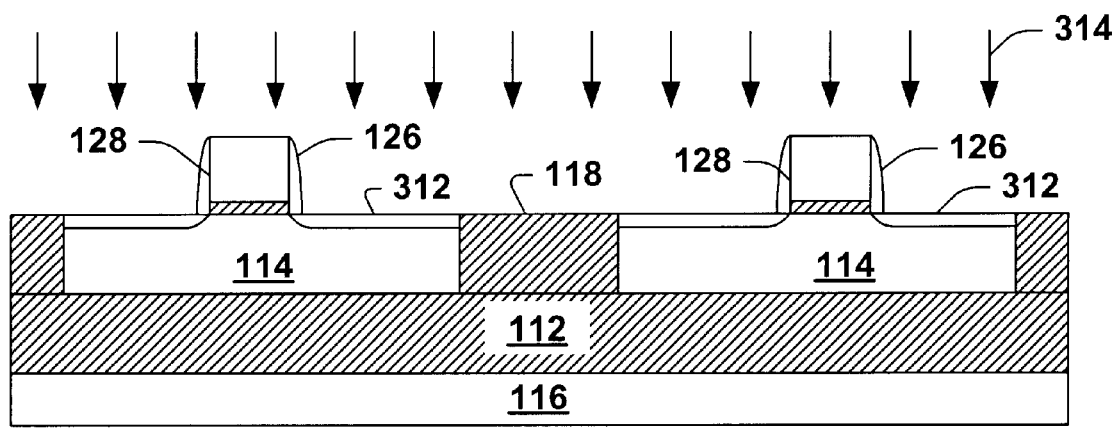

In accordance with yet another aspect of the present invention, a method of forming a transistor using a double silicide process is illustrated in FIG. 12 and designated at reference numeral 300. The method 300 is similar in many respects to the method 100 of FIG. 7, wherein a gate structure 104 is formed over the body 114 and first sidewall spacers 126 are formed on the lateral edges thereof, as illustrated in FIGS. 13A and 13B, respectively. At 310 source/drain regions 312 are formed in the body portion 114 via, for example, an ion implantation 314 using a dose and energy typically associated with the formation of extension regions. Therefore the source/drain regions 312 are substantially shallow and more lightly doped than traditional deep source/drain regions, as illustrated in FIG. 13B.

Figure 13C:
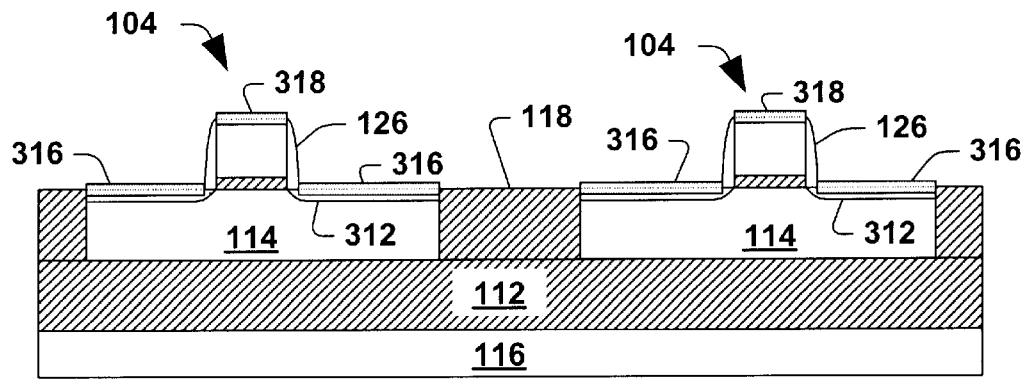
Figure 13D:
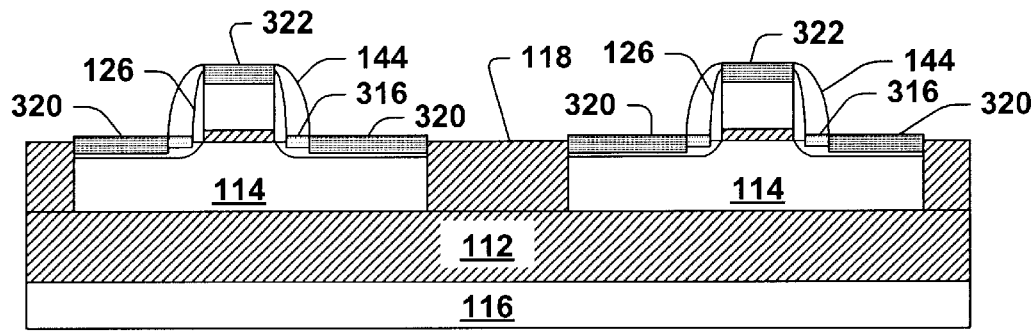

The method 300 continues at 130 and 132 with the formation of a first silicide 316 on the source/drain regions 312 and a first silicide 318 on a top portion of the gate structure 104. The first suicides 316, 318 are formed, for example, by depositing a metal film (e.g., via sputtering or CVD) and subjecting the substrate to thermal processing which causes the portions where the metal and silicon contact to react with one another. The unreacted metal film is then removed, leaving the first silicides 316, 318, as illustrated in FIG. 13C. The method 300 continues at 140 with the formation of second sidewall spacers 144 on the lateral edges of the gate structure 104 which cover the first spacers 126, as illustrated in FIG. 13D. Subsequently, second silicide regions 320, 322 are formed at 150 and 152, respectively. For example, a second metal layer is deposited and subjected to thermal processing, resulting in the first silicide 318 on top of the gate structure 104 being consumed by the second silicide 322, and portions of the first silicide 316 not covered by the second spacers 144 also being consumed, as illustrated in FIG. 13D.

Figure 14:
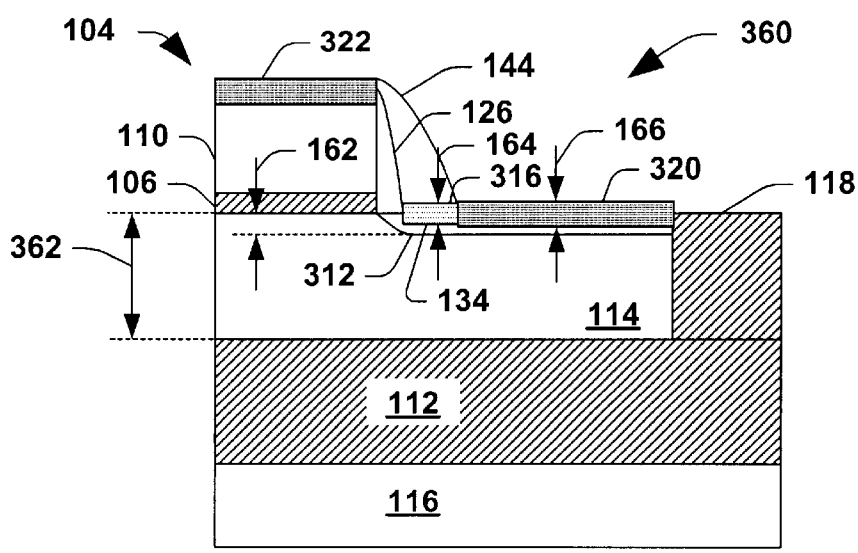
FIG. 14 is a fragmentary cross section diagram illustrating a double silicide transistor structure according to the present invention.

The method 300 of FIG. 12 may be employed to fabricate a transistor structure 360 as illustrated in FIG. 14. The transistor 360 differs from the transistor 160 of FIGS. 9A–9C by the use of extension regions as the source/drains 312, thereby resulting in ultra-shallow source/drain regions. The transistor structure 360 provides substantial performance advantages over conventional devices. For example, since the source/drain regions are extremely shallow, the SOI film depth 362 of the buried oxide or insulating layer 112 in SOI devices can be reduced (more than that illustrated in FIG. 14). In addition, since the source/drain regions 312 are formed with the extension region implant, the additional anneal previously associated with the deep source/drain regions in conventional flows is eliminated. This allows lower temperature silicide films to be formed for the first silicide. Furthermore, the elimination of the additional deep source/drain anneal makes the shallow extension region (now the source/drain regions 312) even more shallow due to less diffusion. Lastly, since the source/drain regions 312 occupy less area, less charge sharing occurs between the source and the drain (due to smaller depletion regions) which allows the transistor 360 to exhibit better gate control than conventional devices to a less $V_T$ roll-off.

In addition to the above advantages, the transistor 360 also exhibits the advantages of the transistor 160 of FIGS. 9A–9C. In particular, the transistor 360 provides for a reduction in the floating-body-effect due to the first silicide 316 being substantially closer to the junction edge (near the channel) than prior art devices, thereby increasing the recombination current of the device.

Although the invention has been shown and described with respect to a certain preferred embodiment or embodiments, it is obvious that equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more other features of the other embodiments as may be desired and advantageous for any given or particular application.

What is claimed is:

1. A method of forming a transistor, comprising:
   forming a gate structure having lateral edges associated therewith over a semiconductor substrate by patterning a gate material using a mask structure overlying a top portion thereof;
   forming first sidewall spacers on the lateral edges of the gate structure;
   forming extension regions in the semiconductor substrate that are self-aligned with respect to the gate structure;
   forming a first silicide on the extension regions, wherein the first silicide does not form on the gate structure due to the mask structure residing thereon;
   forming second sidewall spacers on the lateral edges of the gate structure and covering the first sidewall spacers;
   forming a source region and a drain region under the extension regions, respectively, the source and drain regions being formed via implantation through the first silicide on the extension regions; and
   forming a second silicide on the first silicide and on a top portion of the gate structure after forming the source and drain regions.

2. The method of claim 1, further comprising removing the mask structure prior to forming the second silicide on the top portion of the gate structure.

3. The method of claim 2, wherein the mask structure is removed prior to forming the source and drain regions via implantation, wherein the implantation also dopes the gate structure.

4. The method of claim 1, wherein the first sidewall spacers are formed before the formation of the extension regions.

5. The method of claim 1, wherein forming the first silicide comprises:
   depositing one of a titanium and a tungsten layer over the semiconductor substrate having the gate structure and first sidewall spacers; and
   performing thermal processing, wherein the titanium or tungsten reacts with the source and drain regions to form a titanium silicide or a tungsten silicide thereat, respectively.

6. The method of claim 1, wherein forming the second silicide comprises:
   depositing a metal layer over the semiconductor substrate having the gate structure and first and second spacers thereon; and
   performing thermal processing, wherein the metal reacts with the first suicide over the extension regions in regions not covered by the second spacers and on the top portion of the gate structure.

7. The method of claim 6, wherein the second silicide comprises, tungsten silicide.

8. The method of claim 1, further comprising forming an insulating layer in the semiconductor substrate, thereby defining a bottom portion of the semiconductor substrate below the insulating layer, and a top portion of the semiconductor substrate thereabove, and wherein the extension regions and source and drain regions are formed in the top portion of the semiconductor substrate, thereby forming a silicon-over-insulator (SOI) transistor.

9. A method of forming a transistor, comprising:
   forming a gate structure having lateral edges associated therewith over a semiconductor substrate by patterning a gate material using a mask structure overlying a top portion thereof;
   forming first sidewall spacers on the lateral edges of the gate structure;
   forming source and drain regions in the semiconductor substrate that are self-aligned with respect to the gate structure with an extension region implant;
   forming a first silicide on the source and drain regions, wherein the first silicide does not form on the gate structure due to the mask structure residing thereon;
   forming second sidewall spacers on the lateral edges of the gate structure and covering the first sidewall spacers; and
   forming a second silicide on the first silicide and on a top portion of the gate structure after forming the source and drain regions.

10. The method of claim 9, further comprising removing the mask structure prior to forming the second silicide on the top portion of the gate structure.

11. The method of claim 10, wherein the mask structure is removed prior to forming the source and drain regions via the extension region implant, wherein the implantation also dopes the gate structure.

12. The method of claim 9, wherein the first sidewall spacers are formed before the formation of the source and drain regions.

13. The method of claim 9, wherein forming the first silicide comprises:
   depositing one of a titanium and a tungsten layer over the semiconductor substrate having the gate structure and first sidewall spacers; and
   performing thermal processing, wherein the titanium or tungsten reacts with the source and drain regions to form a titanium silicide or a tungsten silicide thereat, respectively.

14. The method of claim 9, wherein forming the second silicide comprises:
   depositing a metal layer over the semiconductor substrate having the gate structure and first and second spacers thereon; and
   performing thermal processing, wherein the metal reacts with the first silicide over the source and drain regions in regions not covered by the second spacers and on the top portion of the gate structure.

15. The method of claim 14, wherein the second silicide comprises tungsten silicide.

16. The method of claim 9, further comprising forming an insulating layer in the semiconductor substrate, thereby defining a bottom portion of the semiconductor substrate below the insulating layer, and a top portion of the semiconductor substrate thereabove, and wherein the extension regions and source and drain regions are formed in the top portion of the semiconductor substrate, thereby forming a silicon-over-insulator (SOI) transistor.

* * * * *

UNITED STATES PATENT AND TRADEMARK OFFICE
CERTIFICATE OF CORRECTION

PATENT NO. : 6,642,119 B1
DATED : November 4, 2003
INVENTOR(S) : Mario M. Pelella, Shankar Sinha and Simon S. Chan It is certified that error appears in the above-identified patent and that said Letters Patent is hereby corrected as shown below:

Column 7,
Line 29, please replace the word "suicides" with the word -- silicides --; and please replace the word "about" with the word -- abut --.

Column 10,
Line 28, please replace the word "suicides" with the word -- silicides --.

Signed and Sealed this

Twenty-third Day of December, 2003

JAMES E. ROGAN
*Director of the United States Patent and Trademark Office*